(12) United States Patent
Hino et al.

(10) Patent No.: US 7,372,164 B2
(45) Date of Patent: May 13, 2008

(54) SEMICONDUCTOR DEVICE WITH PARALLEL INTERCONNECTS

(75) Inventors: Yoshinori Hino, Gunma (JP); Naoei Takeishi, Niigata (JP); Toshimitsu Taniguchi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/049,417

(22) Filed: Feb. 2, 2005

(65) Prior Publication Data

US 2005/0156250 A1    Jul. 21, 2005

Related U.S. Application Data

(62) Division of application No. 10/076,154, filed on Feb. 14, 2002, now Pat. No. 6,873,053.

(30) Foreign Application Priority Data

Feb. 16, 2001  (JP) ............. P. 2001-039294
Feb. 16, 2001  (JP) ............. P. 2001-039295

(51) Int. Cl.
*H01L 23/48*   (2006.01)
(52) U.S. Cl. .......... 257/774; 257/211; 257/207; 257/208; 257/288; 257/773; 257/758
(58) Field of Classification Search .......... 257/774, 257/404, 403, 758, 773, 208, 211, 207, 288, 257/382
See application file for complete search history.

(56) References Cited

U.S. PATENT DOCUMENTS 5,760,600 A * 6/1998 Kasai .......... 324/769
6,031,257 A   2/2000 Noto et al.
6,033,944 A * 3/2000 Shida .......... 438/199
6,124,604 A * 9/2000 Koyama et al. .......... 257/72
6,160,294 A  12/2000 Hashimoto
6,383,868 B1* 5/2002 Parekh et al. .......... 438/253
6,476,491 B2 11/2002 Harada et al.

FOREIGN PATENT DOCUMENTS

| JP | 7-94595 | 4/1995 |
|---|---|---|
| JP | 08-130304 | 5/1996 |
| JP | 09-148526 | 6/1997 |
| JP | 2000-174268 | 6/2000 |

OTHER PUBLICATIONS

Clement H. Wann, "A Comparative Study of Advanced MOSFET Concepts", *IEEE Transactions of Electronics Devices*, vol. 43, pp. 1742-1743 (1996).
"Phenomena in Graded Junction Devices"; *IEEE, IRPS*, p. 71, (1989).
*ULSI Technology*, McGraw-Hill, p. 443, (1996).

* cited by examiner

*Primary Examiner*—Evan Pert
*Assistant Examiner*—Tan Tran
(74) *Attorney, Agent, or Firm*—Fish & Richardson P.C.

(57) ABSTRACT

A semiconductor forming transistors on a semiconductor substrate includes a low concentration source/drain region formed in the semiconductor substrate, a high concentration source/drain region formed in the source/drain region, a gate electrode formed on the substrate through gate oxide film, a P type body region formed under the gate electrode and placed between the source/drain regions and, plug contact portions contacting the source/drain region and arranged in plural, and a source/drain electrode connecting to the source/drain region with contact through the contact portions.

13 Claims, 15 Drawing Sheets

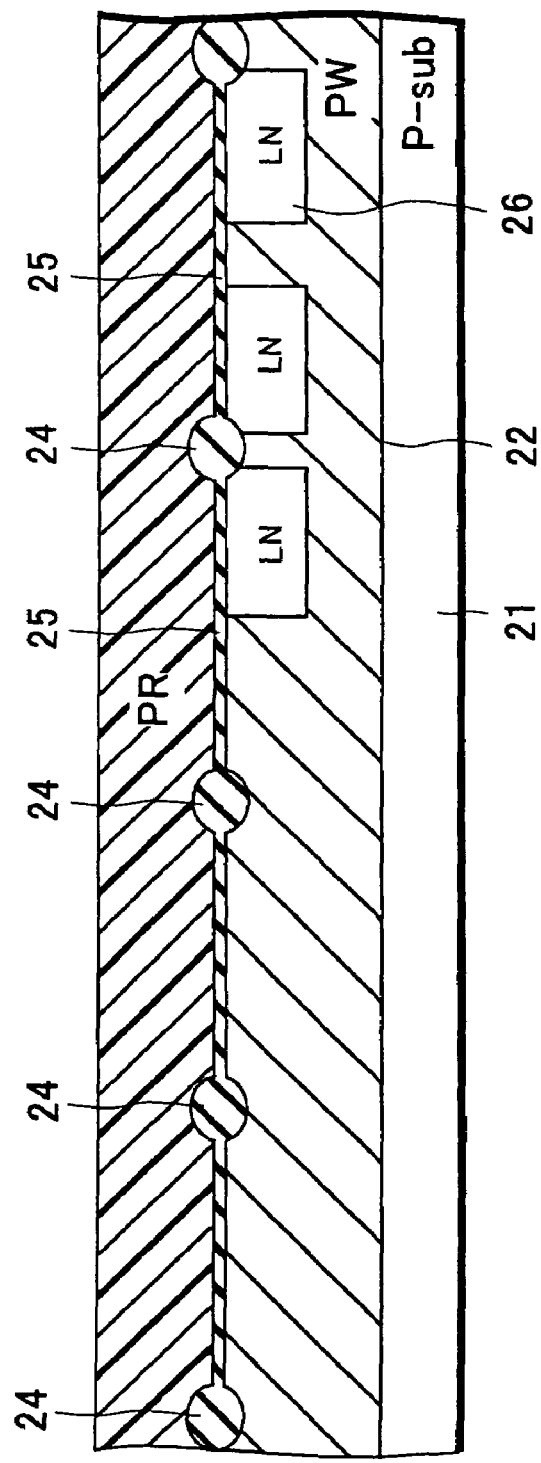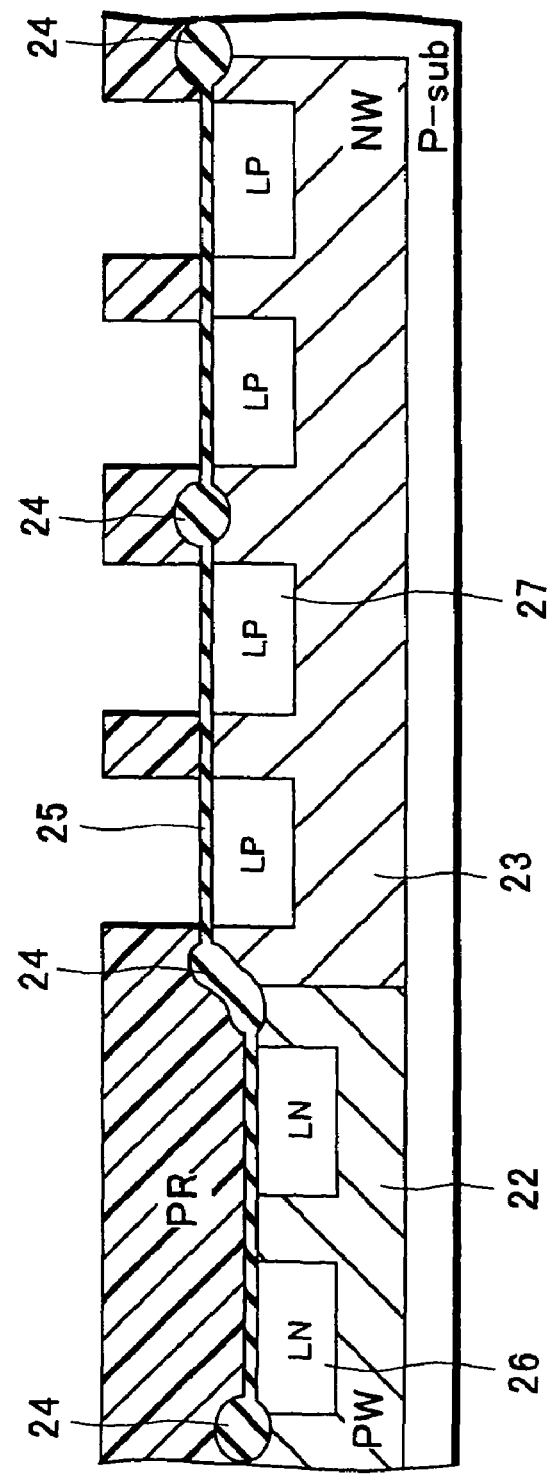

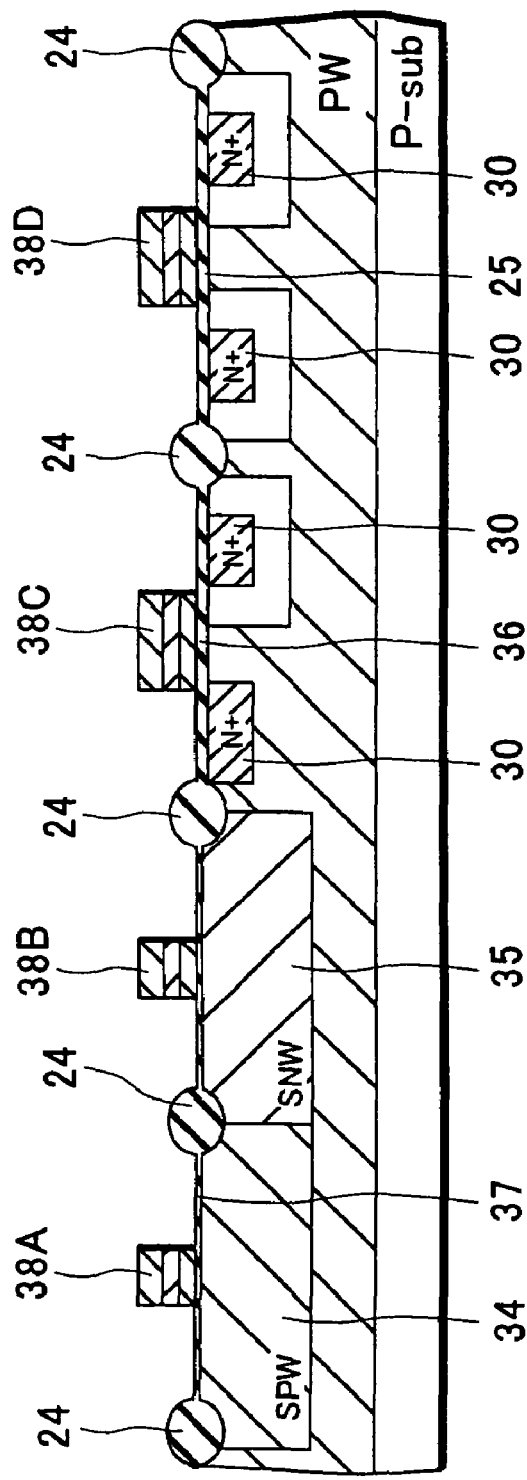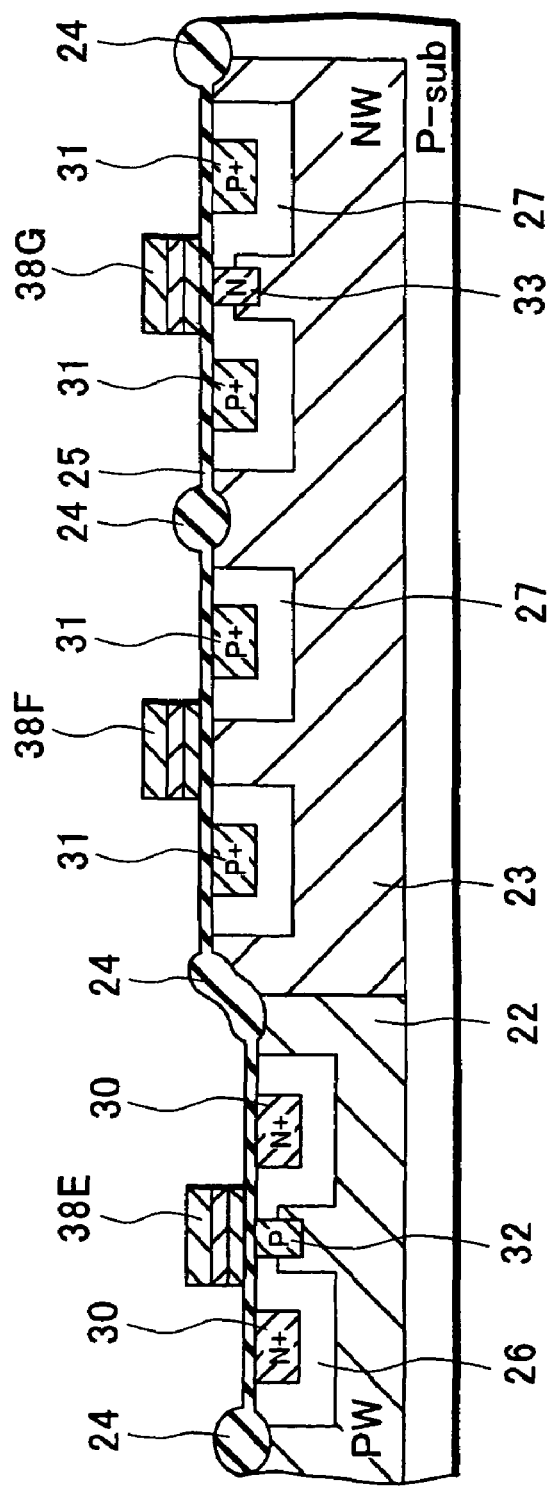

FIG.10A
FIG.10B
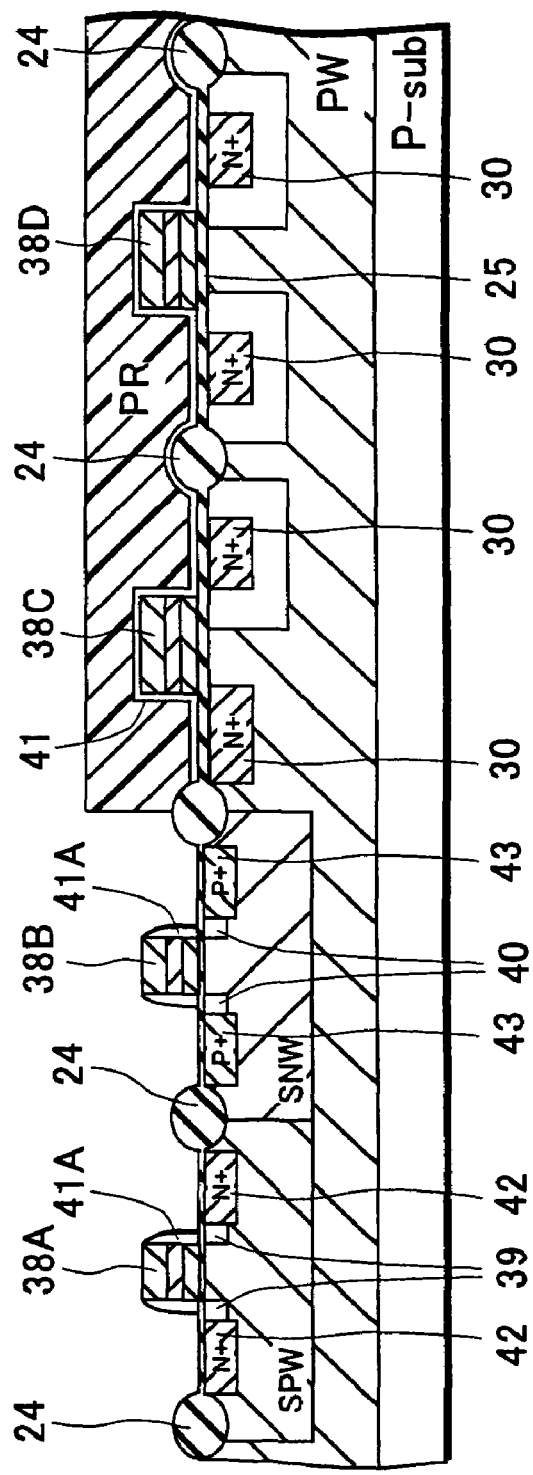
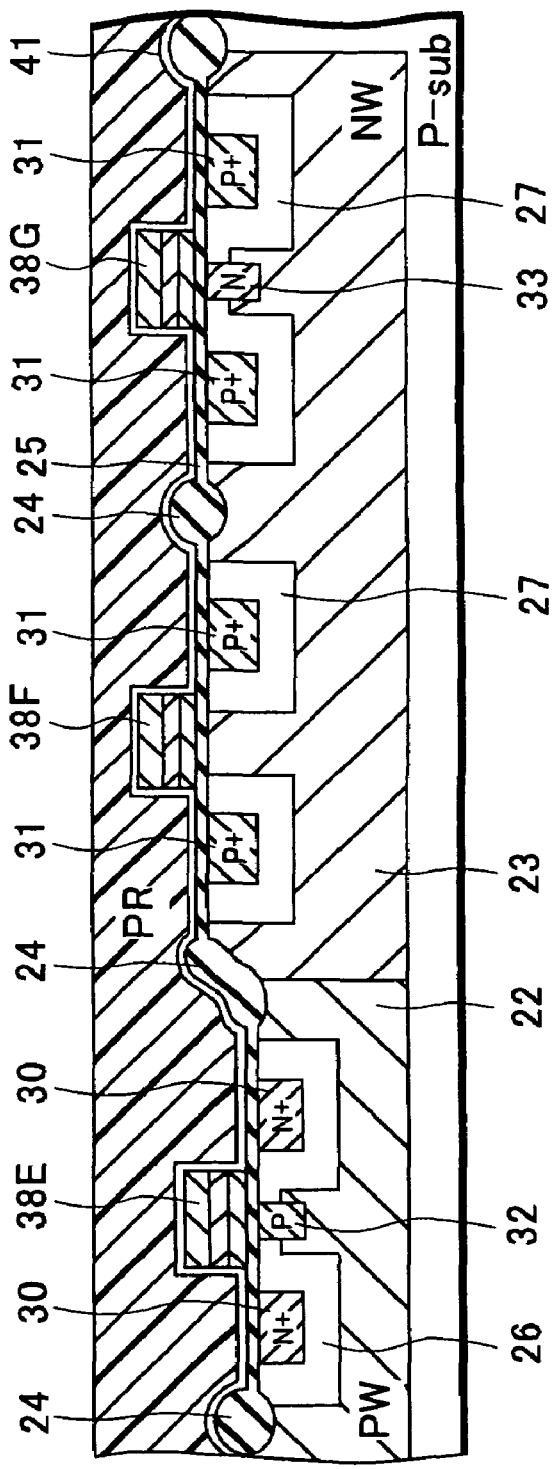

SEMICONDUCTOR DEVICE WITH PARALLEL INTERCONNECTS

CROSS-REFERENCE TO RELATED APPLICATION(S)

This application is a divisional of U.S. Ser. No. 10/076,154, filed Feb. 14, 2002 now U.S. Pat. No. 6,873,053, which in turn claims the benefit of Japanese Application No. 2001-039294, filed Feb. 16, 2001.

BACKGROUND OF THE INVENTION

The present invention relates to a semiconductor device and method of manufacturing the semiconductor device and, more particularly, technique reducing contact resistance at contacting upper layer and lower layer. Further the invention relates to forming a bump electrode.

Explanation is made below on the conventional semiconductor device and method of manufacturing the semiconductor device, with reference to the drawings.

In FIG. 14, numeral 1 denotes a semiconductor substrate, on which a gate electrode 3 is formed through gate oxide film 2, and source/drain regions 4 are formed so as to be adjacent to the gate electrode 3. A interlayer insulating film 5 covering the gate electrode 3 is formed, and source/drain electrodes 7 contacting the source/drain regions 4 through contact holes 6 formed at the interlayer insulating film 5 are formed.

In FIG. 15 and FIG. 16, numeral 11 denotes a semiconductor substrate, on which an insulating film 12 including LOCOS oxide film is formed, and a lower layer wiring 13 is formed on the insulating film 12.

An interlayer insulating film 14 is formed so as to cover the lower layer wiring 13, and an upper layer wiring 16 is formed so as to contact the lower wiring 13 through via holes 15 formed at the interlayer insulating film 14.

A passivation film 17 is formed so as to cover the upper layer wiring 16, and a gold bump electrode 18 is formed at a pad portion 17A where the passivation film 17 is opened.

Here, in the semiconductor device shown in FIG. 14, step coverage of metal film in a contact hole decreases in accordance with the reduction of the contact hole when metal film such as Al and the like is deposited by spattering method at forming the source/drain electrode. Because of that, a device is made practicable nowadays, wherein film such as tungsten film and the like having conductivity in the contact hole is buried by CVD method and, on the film, metal film such as Al etc. is formed for metal wiring layer by patterning.

In the case of constitution of various kinds of transistors adopting such the plug contact technique, when sizes of contact holes are various, recess depth at etch back after burying become various, and to say extremely, the recess values possibly become worse to similar degree as the case without burring step coverage of metal film.

Because of that, in the case of constitution of various kinds of transistors by michronization process such as 0.35 μm, it is need to make each size of contact hole even to the size of contact hole of the transistor in the minimum design rule, and contact resistance becomes high in some transistor so that there is a problem of rise of on-resistance.

In the semiconductor device shown in FIG. 15 and FIG. 16, when there are the via holes 15 under the above-mentioned pad portion, difference in surface of the via holes remains even on surface of the gold bump electrode 18. Because of that, difference in surface of the gold bump electrode 18 causes decrease of yield at mounting on mounting points of TAB (Tape Automated Bonding) and the like for example.

Especially, in the case of constitution of various kinds of transistors by michronization process such as 0.35 μm, opening diameter of the pad portion is constituted by plural micro via holes because the minimum dimension is applied for dimension of each via hole (contact hole). Because of that, difference in surface remains like surface of the above-mentioned gold bump electrode 18.

SUMMARY OF THE INVENTION

According to the present invention, a semiconductor device and a method of manufacturing the semiconductor device of the invention having a transistor on a semiconductor substrate include contact portions for connecting a lower layer and an upper layer with contact arranged in plural lines.

A semiconductor device and a method of manufacturing the semiconductor device of the invention having a first transistor and a second transistor on a semiconductor substrate includes numbers of forming contact portions for connecting a lower layer and an upper layer with contact are different at the first transistor and the second transistor.

A semiconductor device and a method of manufacturing the semiconductor device of the invention include contact portions for connecting the lower layer and the upper layer with contact arranged in one line in the first transistor, and contact portions for connecting the lower layer and the upper layer with contact arranged in plural lines in the second transistor.

A semiconductor device and a method of manufacturing the semiconductor device of the invention include the second transistor having a source/drain region so as to be adjacent to a gate electrode, and a semiconductor region constituting a channel is formed under the gate electrode.

A semiconductor device and a method of manufacturing the semiconductor device of the invention include a low concentration region of the same conductive type formed so as to connect to the source/drain region and to contact the semiconductor region under the gate electrode of the second transistor.

A semiconductor device and a method of manufacturing the semiconductor device of the invention include a low concentration region of the same conductive type being extended shallowly to the semiconductor so as to connect to the source/drain region and to contact the semiconductor region under the gate electrode of the second transistor.

According to a semiconductor device and a method of manufacturing the semiconductor device of the invention, the contact portions are provided for connecting to the source/drain region with contact.

According to a semiconductor device and a method of manufacturing the semiconductor device of the invention, the contact portions are provided for connecting to the lower layer wiring and upper layer wiring with contact.

A semiconductor device and a method of manufacturing the semiconductor device of the invention include a film having conductivity buried in the contact portion.

Further, a semiconductor device including an upper layer wiring connected to the lower layer wiring with contact through a via hole formed under a bump electrode covering lower layer wiring and method of manufacturing the semiconductor device of the invention have the via hole formed at region except under a bump electrode constituted at a pad portion.

Preferably, in the semiconductor device and method of manufacturing the semiconductor device, the lower layer wiring is arranged under the bump electrode.

A method of manufacturing the device includes the steps of: forming in the interlayer insulating film so as to cover the lower layer wiring; forming the upper layer wiring so as to contact the lower layer wiring through the via hole after forming the via hole at region except a pad forming portion of the interlayer insulating film; and forming a bump electrode at a pad portion.

Thus, smooth of surface of the bump electrode is designed because the via hole is not formed under the bump electrode constituted at the pad portion.

Further, smooth at periphery of the pad portion is not damaged by arranging the lower layer wiring even under the bump electrode.

A semiconductor device of the invention includes: a gate electrode formed on a semiconductor substrate through gate oxide film; a source/drain region formed so as to be adjacent to the gate electrode; a semiconductor region formed under the gate electrode and constituting a channel; a lower layer wiring connected to the source/drain region with contact; a via hole formed in the interlayer insulating film covering the lower layer wiring and formed at region except a bump electrode constituted at a pad portion; and an upper layer wiring connected to the lower layer wiring with contact through the via hole.

A method of manufacturing the device including the steps of: forming a low concentration opposite conductive type source/drain region by ion-implanting opposite conductive type impurity in one conductive type semiconductor; forming a low concentration opposite conductive type region connecting to the low concentration opposite conductive type source/drain region by ion-implanting opposite conductive type impurity; forming a high concentration opposite conductive type source/drain region in the low concentration opposite conductive type source/drain region by ion-implanting opposite conductive type impurity; forming a one conductive type body region dividing the opposite conductive type region under the gate electrode by ion-implanting one conductive type impurity; forming a lower layer wiring connecting to the source/drain region with contact through interlayer insulating film covering the gate electrode; forming a via hole at region except a bump electrode constituted at a pad portion of the interlayer insulating film after forming the interlayer insulating film so as to cover the lower layer wiring; and forming an upper layer wiring connecting to the lower layer wiring with contact through the via hole.

BRIEF DESCRIPTION OF THE DRAWINGS

FIGS. 2A and 2B are sectional views showing a method of manufacturing a semiconductor device of the present invention;

FIGS. 8A and 8B are sectional views showing a method of manufacturing a semiconductor device of the present invention;

FIGS. 10A and 10B are sectional views showing a method of manufacturing a semiconductor device of the present invention;

DETAILED DESCRIPTION OF THE PREFERRED EMBODIMENT

With reference to the drawings, explanation will be now made on a semiconductor device and method of manufacturing the semiconductor device of the present invention in the case applied to the semiconductor device mounted with of various kinds of MOS transistors constituting various kinds of display drivers such as liquid crystal driver and EL (electroluminescence) driver.

The display driver is configured with, as viewed from the left in FIG. 10A, logic N-channel MOS and P-channel MOS transistors (e.g. on 3 V), an N-channel MOS transistor (e.g. on 30 V) for a level shifter and an N-channel high-voltage MOS transistor of high withstand voltage (e.g. on 30 V) and, as viewed from the left in FIG. 10B, an N-channel high-voltage MOS transistor of high withstand voltage (e.g. on 30 V) reduced in on-resistance, a P-channel high-voltage MOS transistor of high withstand voltage (e.g. on 30 V) and a P-channel high-voltage MOS transistor of high withstand voltage (e.g. on 30 V) reduced in on-resistance. Note that, in the below explanation, the MOS high-voltage transistor reduced in on-resistance is referred to as an SLED (Slit channel by counter doping with extended shallow drain) MOS transistor in order to differentiate between the high-voltage MOS transistor and the high-voltage MOS transistor reduced in on-voltage, for the sake of explanation.

In the semiconductor device mounted with various MOS transistors constituting such a display driver, as shown in FIGS. 10A and 10B, an N type well region 23 forming the P-channel high-voltage transistor and the P-channel high-voltage SLEDMOS transistor reduced in on-resistance is configured in a step higher region, while a P type well region 22 forming the other MOS transistors is configured in a step lower region. In other words, structuring is made to arrange the precise logic (e.g. 3V) N-channel MOS and P-channel MOS transistors in the step lower region.

Explanation is made below on a method of manufacturing a semiconductor device mounted with various transistors constituting the display driver described above.

Figure 1A:
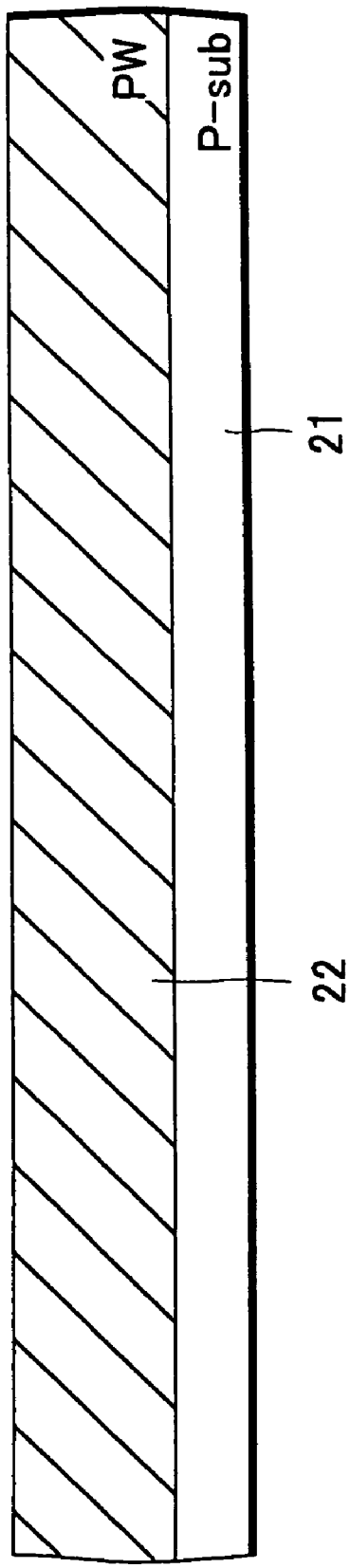
FIGS. 1A and 1B are sectional views showing a method of manufacturing a semiconductor device of the present invention.
Figure 1B:
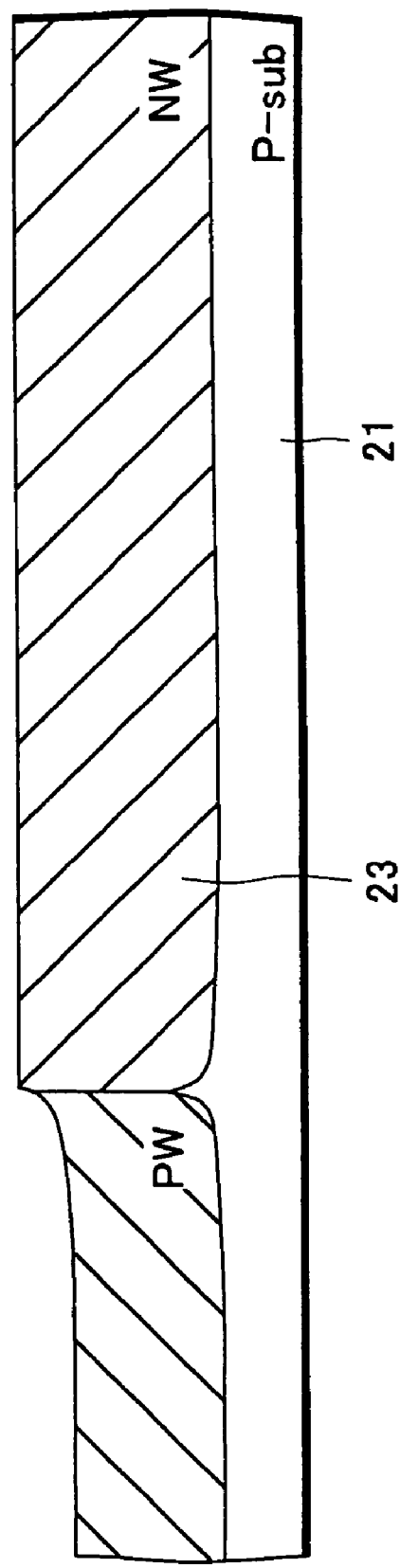

In FIGS. 1A and 1B, in order to define a region for forming various MOS transistors, a P type well (PW) 22 and an N type well (NW) 23 are first formed using LOCOS technique, e.g. in a p type semiconductor substrate (P-sub).

That is, although explanation with showing is omitted, a pad oxide film and a silicon nitride film are formed on the well region of the semiconductor substrate 21. The pad oxide film and silicon nitride film is used as a mask to ion-implant boron ion, for example, at an acceleration voltage of approximately 80 keV and a dose of $8\times10^{12}/cm^2$, thereby forming an ion-implant region. Thereafter, the silicon nitride film is used as a mask to oxidize the substrate surface by the LOCOS technique, thereby forming a LOCOS film. At this time, the boron ion implanted in a region beneath the LOCOS film is diffused toward the inward of the substrate to form a P type region.

Next, the pad oxide film and the silicon nitride film are removed. Thereafter, the LOCOS film is used as a mask to ion-implant phosphorus ion to the substrate surface, at an acceleration voltage of approximately 80 keV and a dose of $9\times10^{12}/cm^2$, thereby forming an ion-implant region 15. Then, the LOCOS film is removed away. Thereafter, the impurity ions implanted in the substrate are thermally diffused to form a P type well and N type well. Thus, as shown in FIGS. 1A and 1B, the P type well 22 formed in the substrate 21 is arranged in a step lower region while the N type well is arranged in a step higher region.

Next, in FIGS. 2A and 2B, a device isolation film 24 is formed to an approximately 500 nm by the LOCOS process in order for device isolation based on the MOS transistor. A thick gate oxide film 25 for withstanding high voltage is formed by thermal oxidation in a thickness of approximately 80 nm on an active region excepting the device isolation region.

Subsequently, the resist film is used as a mask to form first low-concentration N type and P type source/drain regions (hereinafter, referred to as LN region 26, LP region 27). Namely, in a state covering the region of other than an LN region by a not-shown resist film, phosphorus ion, for example, is first ion-implanted to the substrate surface layer at an acceleration voltage of 120 keV and a dose of $8\times10^{12}/cm^2$ thereby forming an LN region 26. Thereafter, in a state covering the region of other than an LP region by a resist film (PR), boron ion, for example, is ion-implanted to the substrate surface layer at an acceleration voltage of 120 keV and a dose of $8.5\times10^{12}/cm^2$ thereby forming an LP region 27. Note that, in actual, the implanted ionic species will be thermally diffused into a LN region 26 and LP region 27 through an anneal process as a later process (e.g. in an $N_2$ atmosphere at 1100° C. for 2 hours).

Figure 3A:
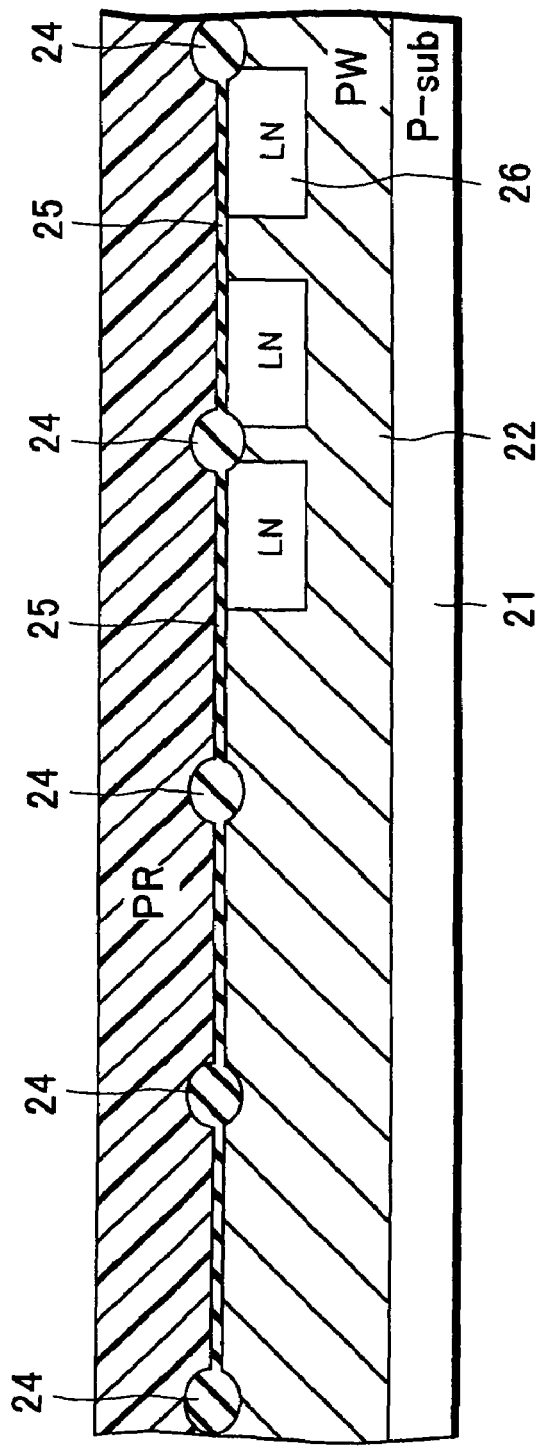
FIGS. 3A and 3B are sectional views showing a method of manufacturing a semiconductor device of the present invention.
Figure 3B:
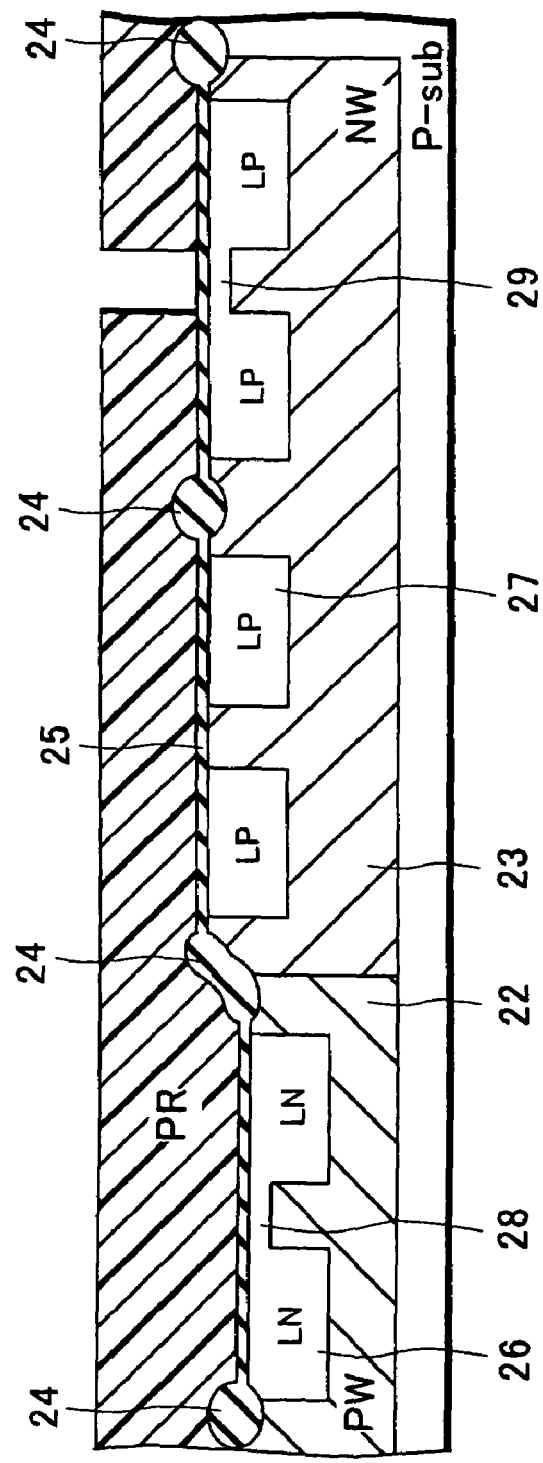

Subsequently, in FIGS. 3A and 3B, using as a mask a resist film at between the LN regions 26 and the LP regions 27 forming the regions for P-channel and N-channel SLED-MOS transistors, second low-concentration N type and P type source/drain regions (hereinafter, referred to as SLN region 28 and SLP region 29) are formed. Namely, in a state covering the region other than the region for an SLN region by a not-shown resist mask, phosphorus ion, for example, is first ion-implanted to the substrate surface layer at an acceleration voltage of 120 keV and a dose of $1.5\times10^{12}/cm^2$ to form an SLN region 28 continuing the LN regions 26. Then, in a state covering the other region of the SLP region by a resist film (PR), boron difluoride ($^{49}BF_2^+$), for example, is ion-implanted to the substrate surface region at an acceleration voltage of 140 keV and a dose of $2.5\times10^{12}/cm^2$ to form an SLP region 29 continuing the LP regions 27. Note that the LN region 26 and the SLN region 28 or the LP region 27 and the SLP region 29 are set nearly equal in impurity concentration or higher in either one.

Figure 4A:
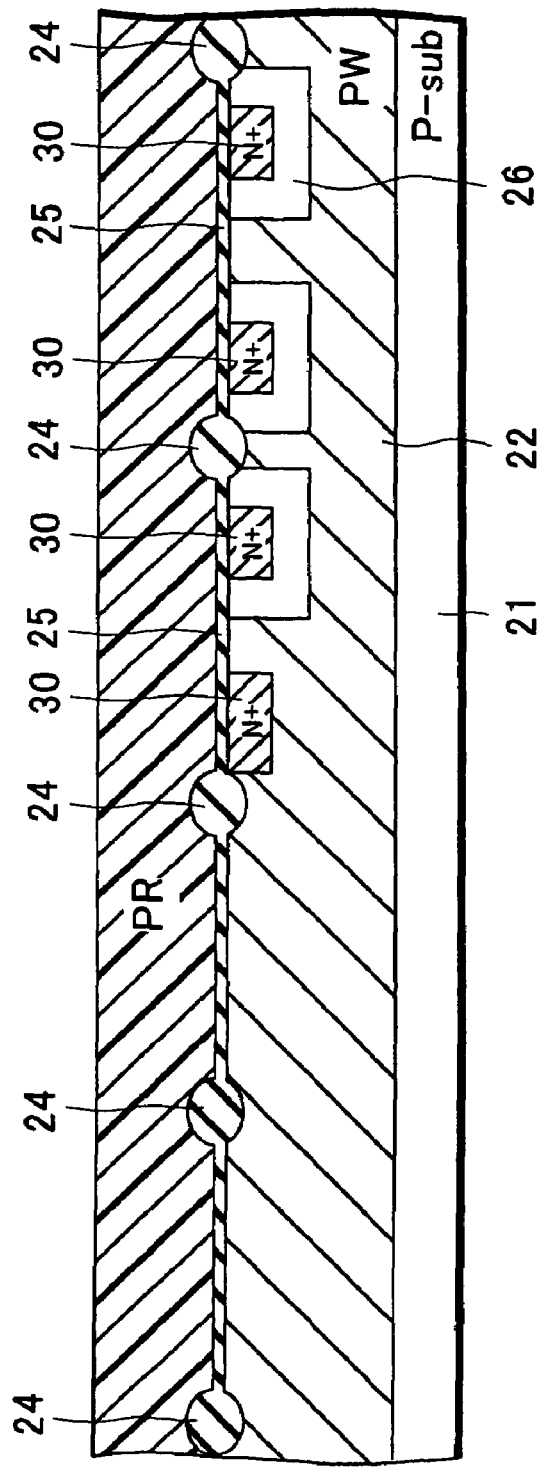
FIGS. 4A and 4B are sectional views showing a method of manufacturing a semiconductor device of the present invention.
Figure 4B:
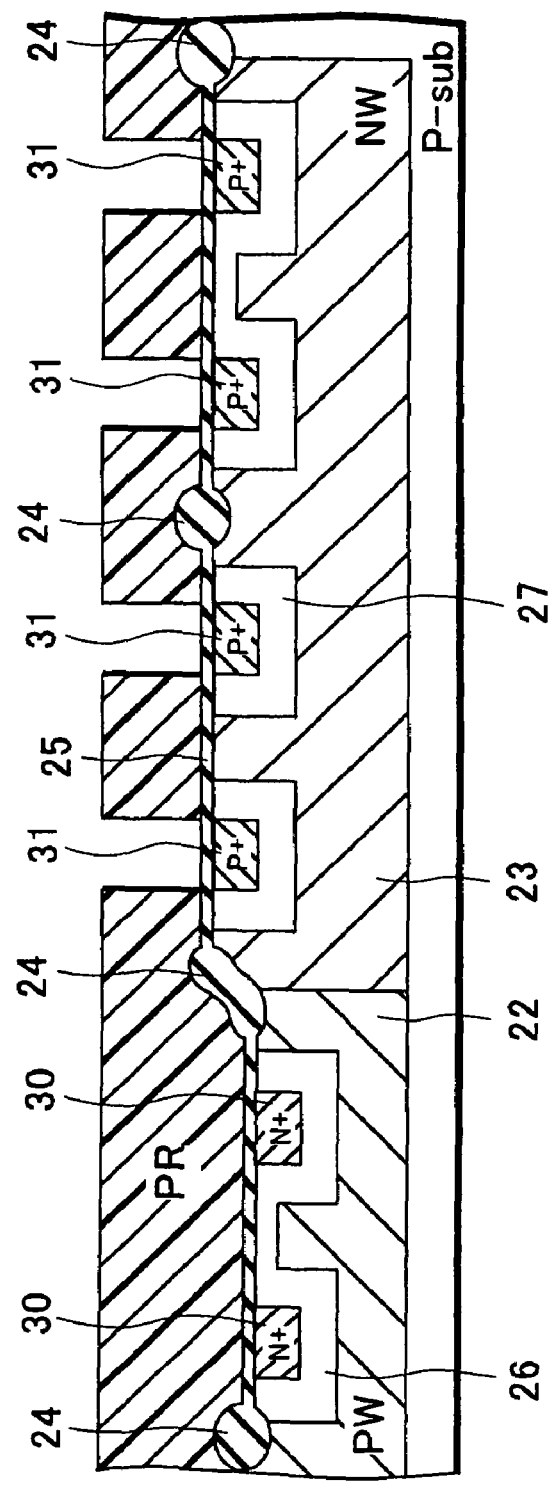

Furthermore, in FIGS. 4A and 4B, a resist film is used as a mask to form high-concentration N type and P type source/drain regions (hereinafter, referred to as N+ region 30, P+ region 31). Namely, in a state covering the other region than a region for an N+ region by a not-shown resist film, phosphorus ion, for example, is first ion-implanted to the substrate surface layer at an acceleration voltage of 80 keV and a dose of $2\times10^{15}/cm^2$ thereby forming an N+ region 30. Thereafter, in a state covering the other region than a region for a P+ region by a resist film (PR), boron difluoride ion, for example, is ion-implanted to the substrate surface layer at an acceleration voltage of 140 keV and a dose of $2\times10^{15}/cm^2$ thereby forming a P+ region 31.

Figure 5A:
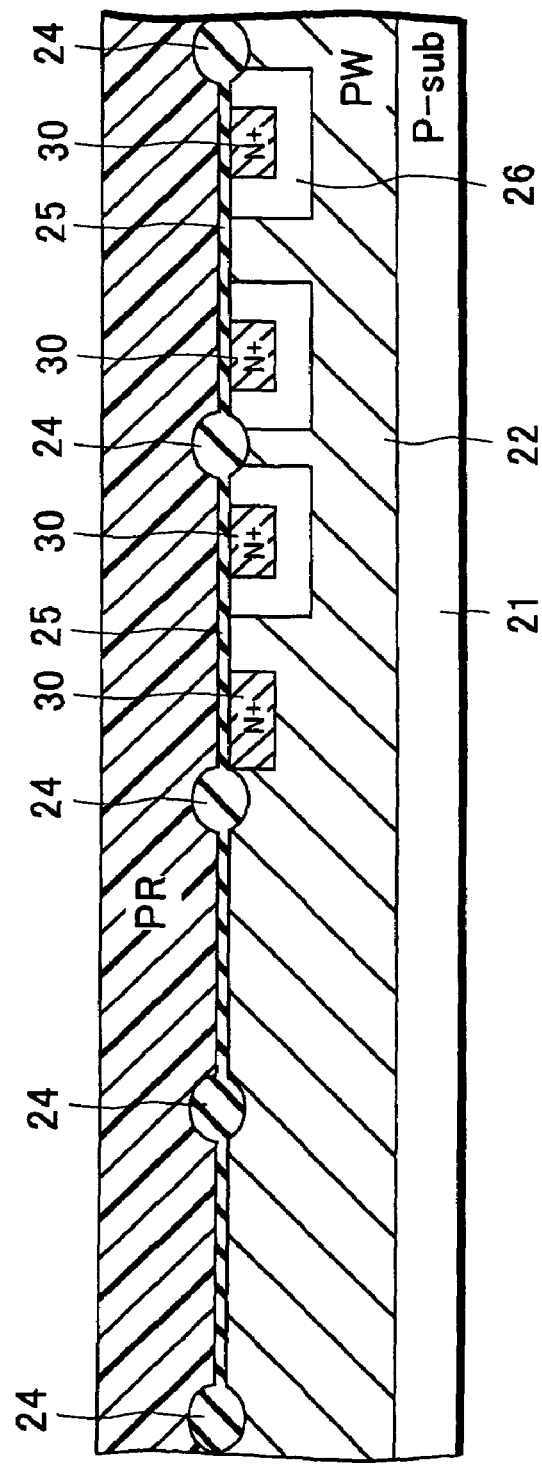
FIGS. 5A and 5B are sectional views showing a method of manufacturing a semiconductor device of the present invention.
Figure 5B:
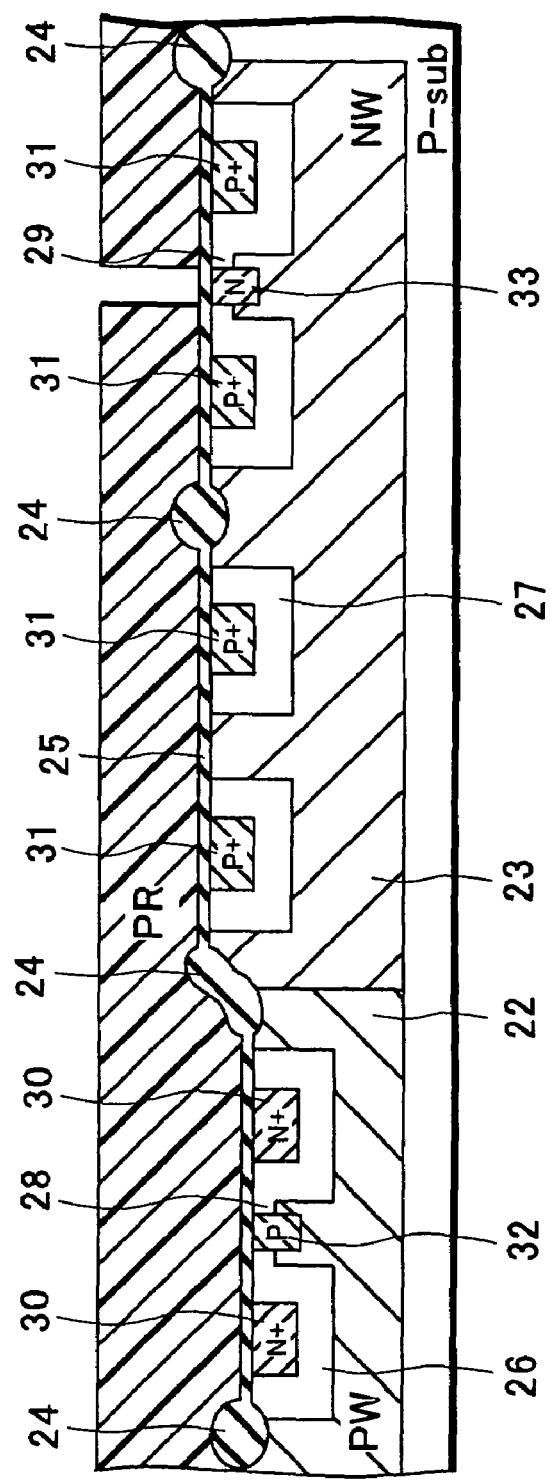

Next, in FIGS. 5A and 5B, using as a mask a resist film having an opening diameter smaller than the mask opening diameter (see FIG. 13) for forming the SLN region 28 and SLP region 29, opposite-conductivity type impurities are ion-implanted to a central area of the SLN region 28 continuing the LN regions 26 and to a central area of the SLP region 29 continuing the LP regions 27, thereby forming a P type body region 32 and an N type body region 33 to respectively separate the SLN region 28 and the SLP region 29. Namely, in a state covering the other region than the region for a P type region by a not-shown resist film, boron difluoride ion, for example, is first ion-implanted to the substrate surface layer at an acceleration voltage of 120 keV and a dose of $5\times10^{12}/cm^2$ thereby forming a P type body region 32. Thereafter, in a state covering the other region than the region for an N type region by a resist film (PR), phosphorus ion, for example, is ion-implanted to the substrate surface layer at an acceleration voltage of 190 keV and a dose of $5\times10^{12}/cm^2$ thereby forming an N type body region 33. Note that the operation processes concerning ion implant shown in FIGS. 3A to 5B may be properly changed in order. The P type body region 32 and the N type body region 33 each will be constituted with a channel in a surface region thereof.

Figure 6A:
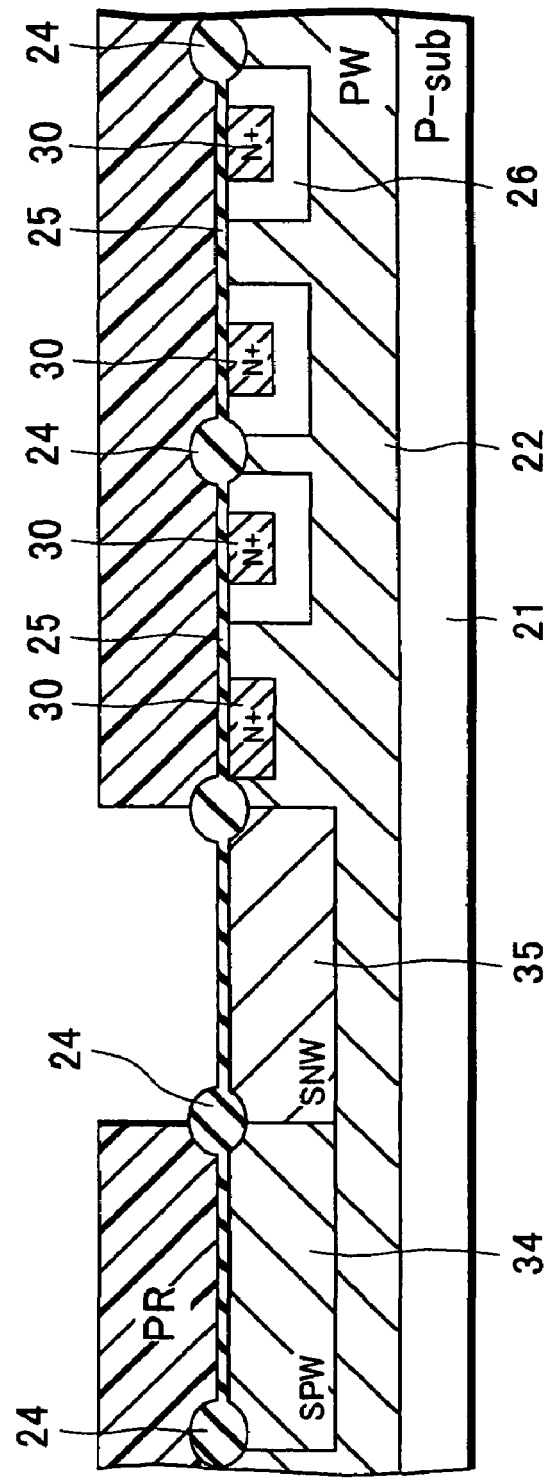
FIGS. 6A and 6B are sectional views showing a method of manufacturing a semiconductor device of the present invention.
Figure 6B:
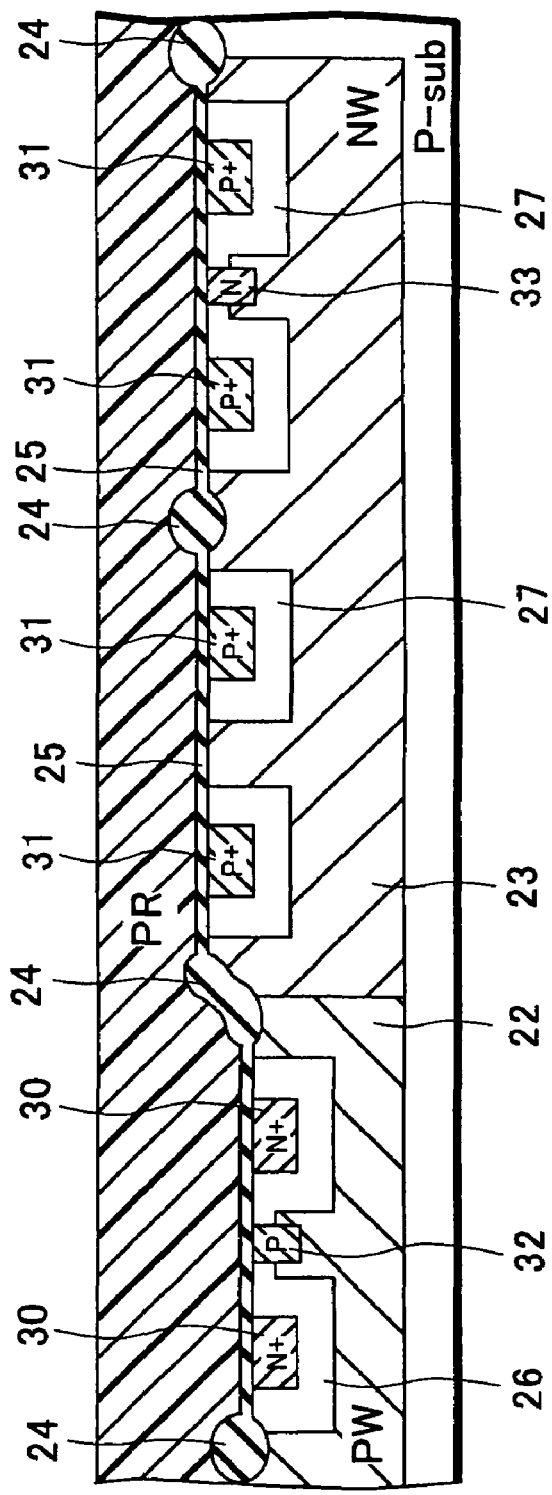

Furthermore, in FIGS. 6A and 6B, a second P type well (SPW) 34 and a second N type well (SNW) 35 are formed in the substrate (P type well 22) at a region for precise N-channel and P-channel MOS normal-voltage transistors.

Namely, using a not-shown resist film having an opening in the region for an N-channel normal-voltage MOS transistor as a mask, boron ion, for example, is ion-implanted to the P type well 22 at an acceleration voltage of approximately 190 keV and a dose of (first implant condition) $1.5\times10^{13}/cm^2$. Thereafter, boron ion is again ion-implanted at an acceleration voltage of approximately 50 keV and a dose of (second implant condition) $2.6\times10^{12}/cm^2$, thus forming a second P type well 34. Also, using a resist film (PR) having an opening in the region for a P-channel normal-voltage MOS transistor as a mask, phosphorous ion, for example, is ion-implanted to the P type well 22 at an acceleration voltage of approximately 380 keV and a dose of $1.5\times10^{13}/cm^2$, thereby forming a second N type well 35. Note that, where a high-acceleration voltage generating apparatus having nearly 380 keV is not available, it is satisfactory to use a double charge scheme for ion-implant two-valence phosphorus ion at an acceleration voltage of approximately 190 keV and a dose of $1.5\times10^{13}/cm^2$. Subsequently, phosphorus ion is ion-implanted at an acceleration voltage of approximately 140 keV and a dose of $4.0 \times 10^{12}/cm^2$.

Figure 7A:
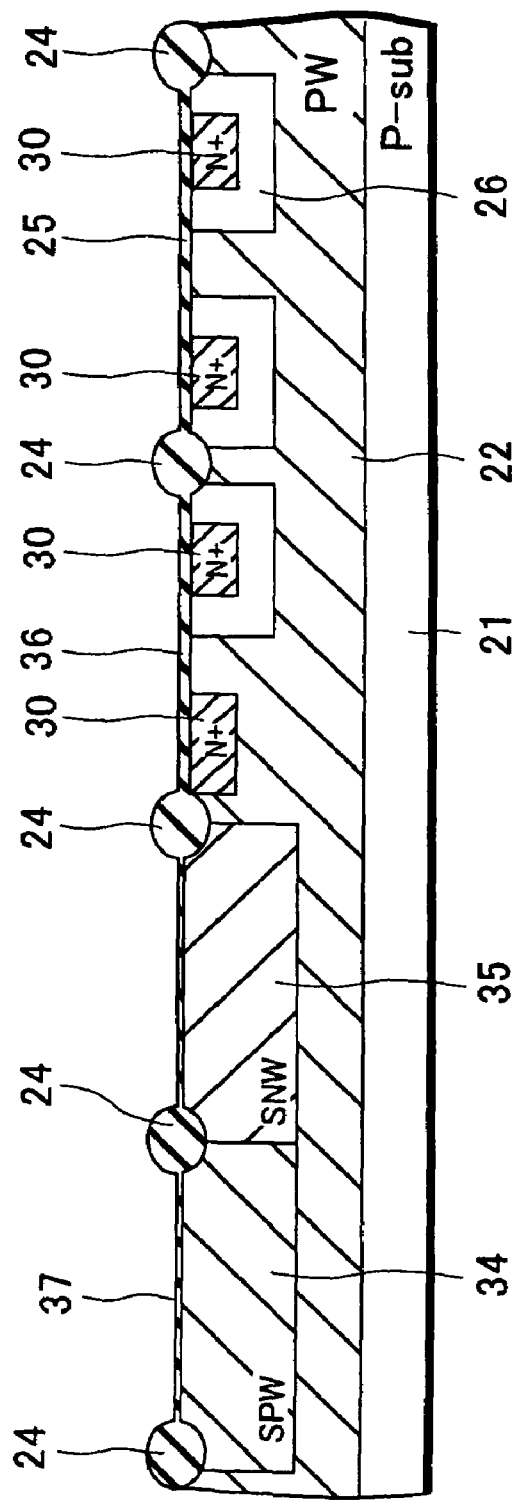
FIGS. 7A and 7B are sectional views showing a method of manufacturing a semiconductor device of the present invention.
Figure 7B:
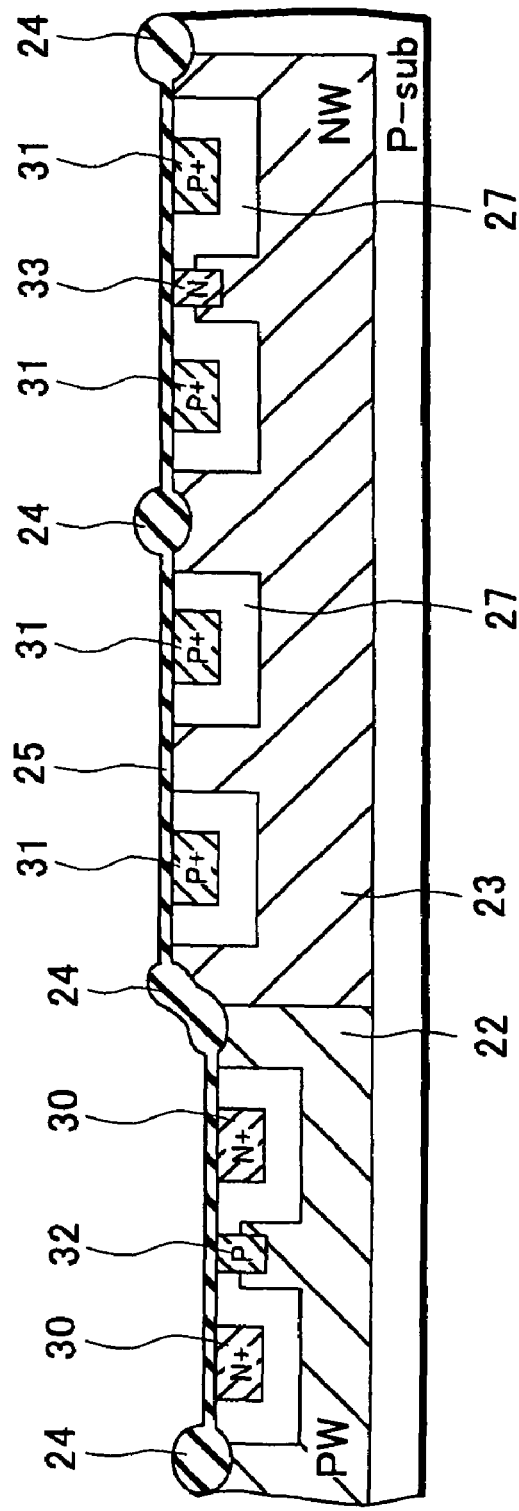

Next, removed is the oxide film 25 from the regions for N-channel and P-channel normal-voltage MOS transistors and for a level-shifter N-channel MOS transistor. Thereafter, as shown in FIGS. 7A and 7B, a gate oxide film having a desired film thickness is newly formed on the above region.

Namely, a gate oxide film 36 is formed on the entire surface by thermal oxidation to approximately 14 nm (approximately 7 nm at this stage, but the film thickness will increase upon forming a gate oxide film for normal voltage referred later) for a level-shifter N-channel MOS transistor. Subsequently, after removing the gate oxide film 36 for a level-shifter N-channel MOS transistor formed on the region for N-channel and P-channel normal-voltage MOS transistors, a thin gate oxide film 37 (approximately 7 nm) for normal voltage is formed on this region by thermal oxidation.

Subsequently, in FIGS. 8A and 8B, a polysilicon film having approximately 100 nm is formed over the entire surface. The polysilicon film is thermally diffused by $POCl_3$ as a thermal-diffusion source thus being made conductive. Thereafter, a tungsten siliside film having approximately 100 nm are formed on the polysilicon film, and further an $SiO_2$ film having approximately 150 nm thereon. Using a not-shown resist film, patterning is made to form gate electrodes 38A, 38B, 38C, 38D, 38E, 38F, 38G for MOS transistors. Note that the $SiO_2$ film serves as a hard mask during the patterning.

Figure 9A:
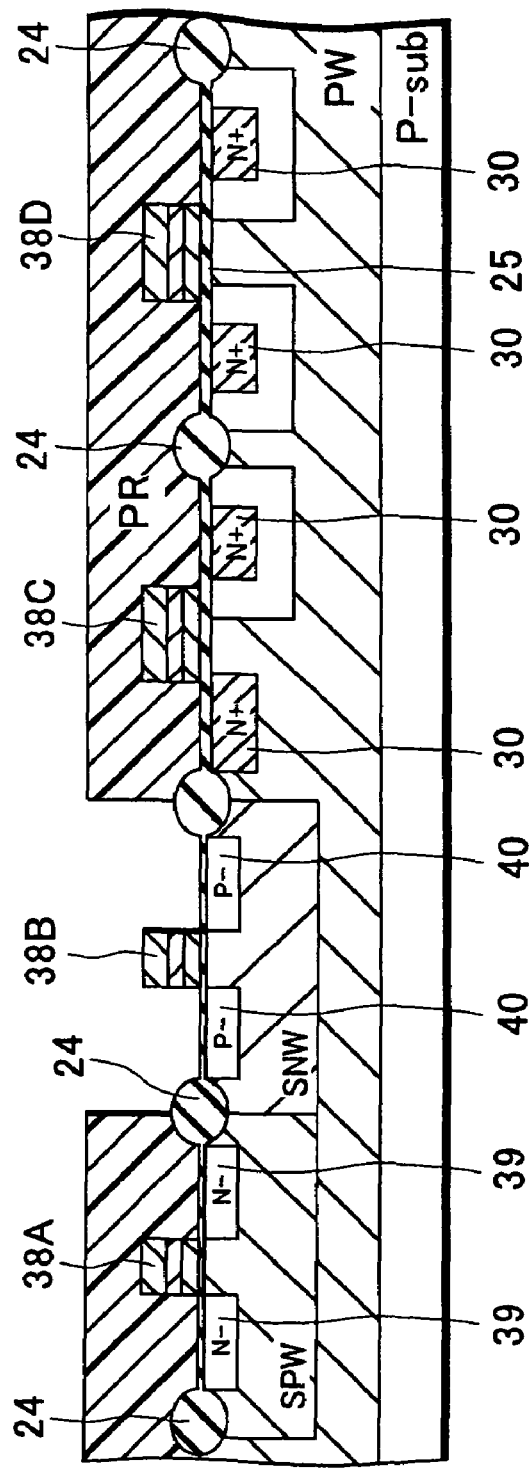
FIGS. 9A and 9B are sectional views showing a method of manufacturing a semiconductor device of the present invention.
Figure 9B:
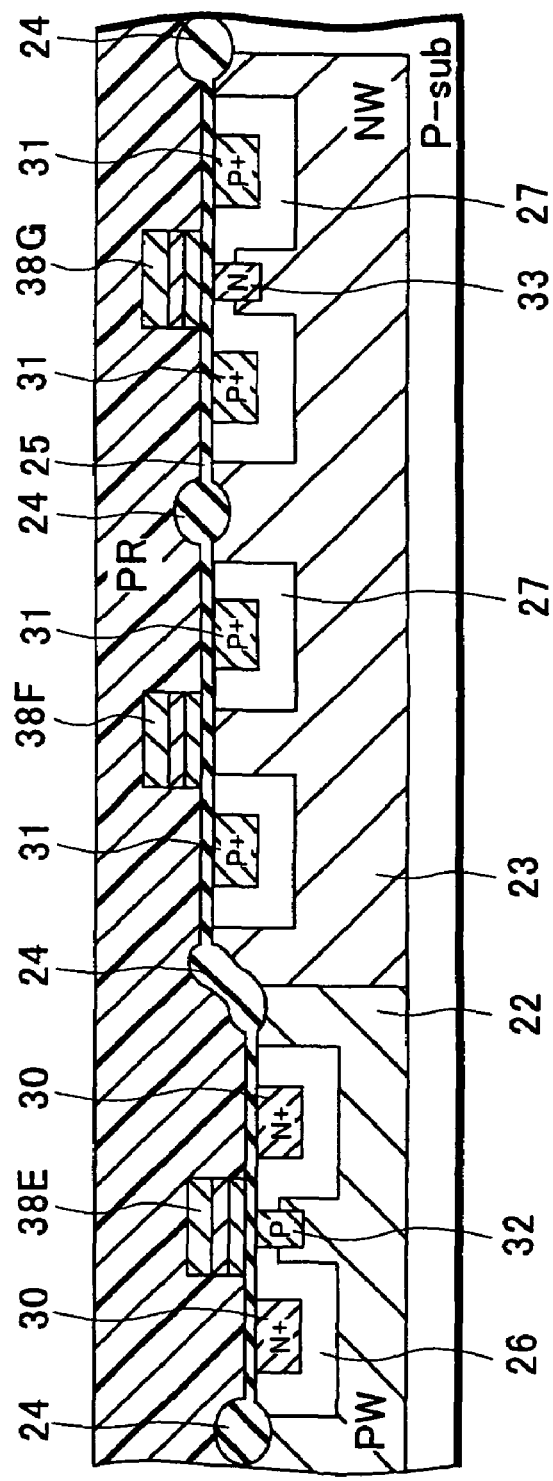

Subsequently, in FIGS. 9A and 9B, low-concentration sorce/drain regions are formed for normal-voltage N-channel and P-channel MOS transistors.

Namely, using as a mask a not-shown resist film covering the other region than the region for low-concentration source/drain regions for a normal-voltage N-channel MOS transistor, phosphorus ion, for example, is ion-implanted at an acceleration voltage of approximately 20 keV and a dose of $6.2 \times 10^{13}/cm^2$ to form low-concentration N-type source/drain regions 39. Meanwhile, using as a mask a resist film (PR) covering the other region than the region for a low-concentration source/drain region for a normal-voltage P-channel MOS transistor, boron difluoride ion, for example, is ion-implanted at an acceleration voltage of approximately 20 keV and a dose of $2 \times 10^{13}/cm^2$ to form low-concentration P-type source/drain regions 40.

Furthermore, as shown in FIGS. 10A and 10B, a TEOS film 41 having approximately 250 nm is formed over the entire surface by the LPCVD process in a manner covering the gate electrodes 38A, 38B, 38C, 38D, 38E, 38F, 38G. The TEOS film 41 is anisotropically etched through a mask of a resist film (PR) having openings in the region for normal-voltage N-channel and P-channel MOS transistors. This forms sidewall spacer films 41A on the sidewalls of the gate electrode 38A, 38B, as shown in FIG. 10A. The TEOS film 41 is left, as it is, in the region covered by the resist film (PR).

Then, using the gate electrode 38A, sidewall spacer films 41A, gate electrode 38B and sidewall spacer films 41A as a mask, high-concentration source/drain regions are formed for normal-voltage N-channel and P-channel MOS transistors.

Namely, using a not-shown resist film covering the other region than the region of high-concentration source/drain regions for a normal-voltage N-channel MOS transistor as a mask, arsenic ion, for example, is ion-implanted at an acceleration voltage of approximately 100 keV and a dose of $5 \times 10^{15}/cm^2$ thereby forming high-concentration N+ source/drain regions 42. Also, using a not-shown resist film covering the other region than the region of high-concentration source/drain regions for a normal-voltage P-channel MOS transistor as a mask, boron difluoride ion, for example, is ion-implanted at an acceleration voltage of approximately 40 keV and a dose of $2 \times 10^{15}/cm^2$ thereby forming high-concentration P+ source/drain regions 43.

An interlayer insulating film, including TEOS and BPSG films, is formed to approximately 600 nm and, thereafter, a metal interconnection layer is formed to have contact to the source/drain regions 30, 31, 42, 43. Thus, completed are normal-voltage N-channel and P-channel MOS transistors, a level-shifter N-channel MOS transistor, high-voltage N-channel and P-channel MOS transistors, and high-voltage N-channel and P-channel SLEDMOS transistors reduced in on-resistance, to constitute a display driver such as a liquid-crystal display driver and an electroluminescence driver.

Embodiment 1

A first embodiment of the invention will be described.

A feature of the first embodiment of the invention is in the structure of contact portion for connecting a metal wring layer 48 to each of the source/drain regions 30, 31, 42, and 43 with contact and the forming method thereof.

The structure of the contact portion of the invention will be explained below referring FIG. 11. Although examples of a normal-voltage MOS transistor (A), a high-voltage MOS transistor (B), and an N-channel SLEDMOS transistor (C) are described in FIG. 11, it is similar about the normal-voltage MOS transistor, the high-voltae MOS transistor, and the P-channel SLEDMOS transistor.

Figure 11:
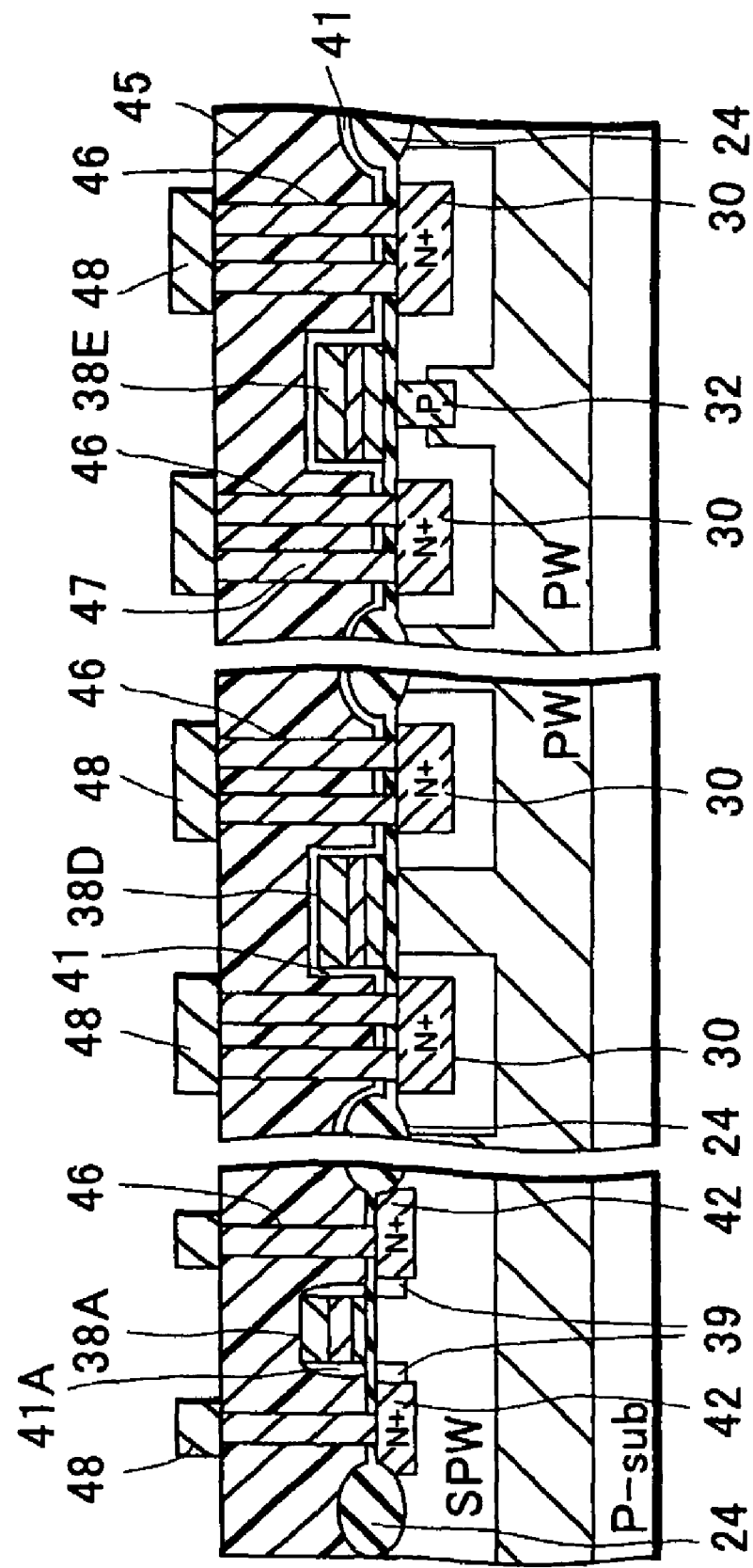
FIG. 11 is a sectional view showing a method of manufacturing a semiconductor device of a first embodiment of the invention.

In the invention, source/drain electrodes are formed by the following the step of: forming contact holes 46 contacting to the source/drain regions 30 and 42 in interlayer insulating film 45; forming plug contact portions 47 by burying film such as tungsten film and the like for example having conductivity in the contact holes 46; and forming metal wring layers 48 of Al film and the like on the plug contact portions 47 as shown in FIG. 11.

Figure 12:
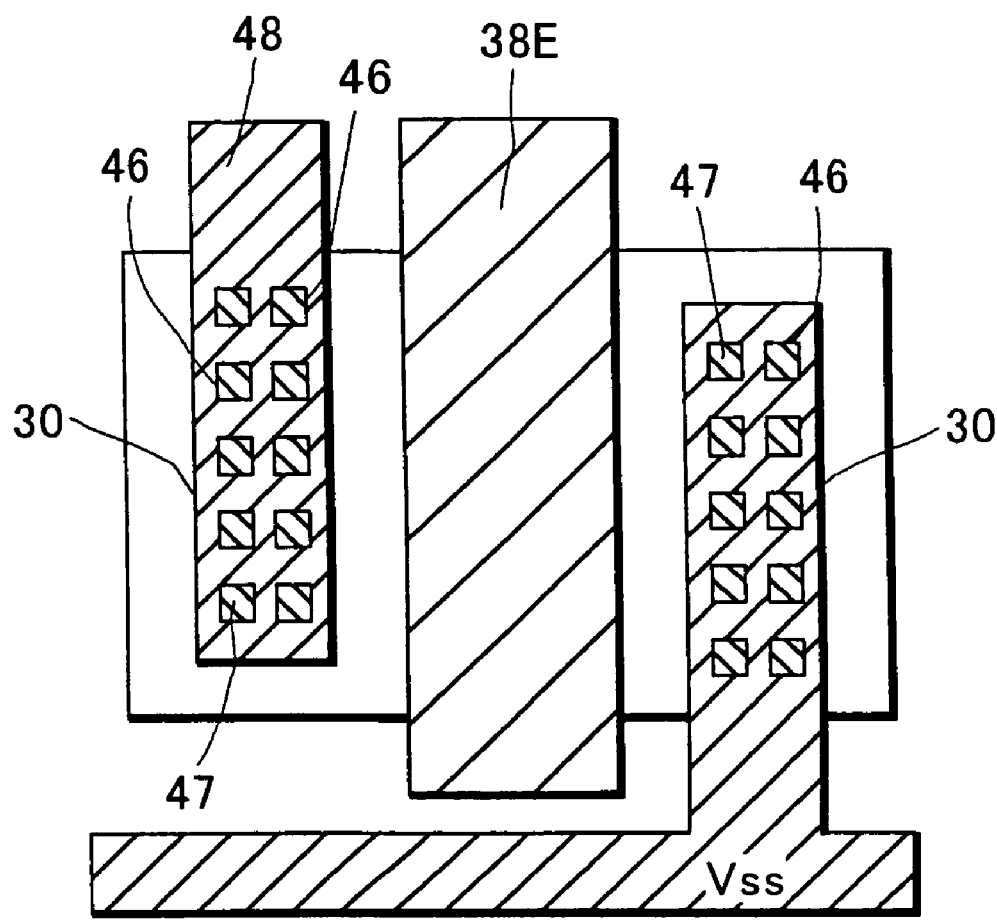
FIG. 12 is a plane view showing a method of manufacturing a semiconductor device of the first embodiment of the invention.

At this time, arrangement of the plug contact portions 47 are different with respect to the transistor of every kind constituting the display driver. In the embodiment, the plug contact portions 47 are arranged in one line at least for the source/drain regions of the normal-voltage MOS transistor (A), and for the source/drain region 30 of the high-voltage MOS transistor (B) and the SLEDMOS transistor (C), the plug contact portions 47 are arranged in plural lines, for example, two lines (See FIG. 12).

Because of that, in the invention, contact resistance is reduced by increasing number of the plug contact portions 47 so as to reduce on-resistance of the transistor.

Thus, in the device having various kinds of transistors and forming contact holes with the minimum dimension at the design rule according to the invention, reduction of contact resistance is designed by setting suitable number of contacts and arranging so as to reduce on-resistance of the transistor.

The film may be buried with polysilicon film and the like not limiting to the tungsten film, and further conductive film may used as wring without etch-back instead of burying the conductive film in the contact hole 46 by etch-back.

Although the plug contact portions 47 are arranged in one line for the normal-voltage MOS transistor, the plug contact portions 47 may be arranged in plural lines for the normal-voltage MOS transistor. By arranging the plug contact portions 47 in plural lines, reliability improves in the normal-voltage MOS transistor arranged near place to a power source pad for example, and constitution arranging the plug contact portions 47 in one line is enough only for transmitting "H" and "L" signals.

Further, although the contact portion for connecting to the source/drain region with contact is described in the embodiment, the invention is not limited to this, and it is applicable for contact portion connecting lower layer wiring and upper layer wiring. Especially, in the device where high withstand voltage and low on-resistance are designed such as SLED-MOS transistor, lower resistance can be realized by applying the invention to the contact portion for connecting the lower layer wiring and the upper layer wiring with contact (for example, two layers wiring and three layers wiring because the process is three layers wiring structure).

Embodiment 2

A second embodiment of the present invention will be described below.

A feature of the second embodiment of the invention is to smooth the surface of the bump electrode by not forming a via hole under the bump electrode constituted at a pad portion in the device where an upper wiring is contacted through the via hole formed at interlayer insulating film covering a lower wiring.

By forming the lower wiring even under the bump electrode, smooth of periphery of the pat portion is not damaged.

A structure of a semiconductor of the invention will be described below referring FIG. 13. Although an example applying the invention for N-channel SLEDMOS transistor in FIG. 13 is introduced, other transistors are formed similarly.

Figure 13:
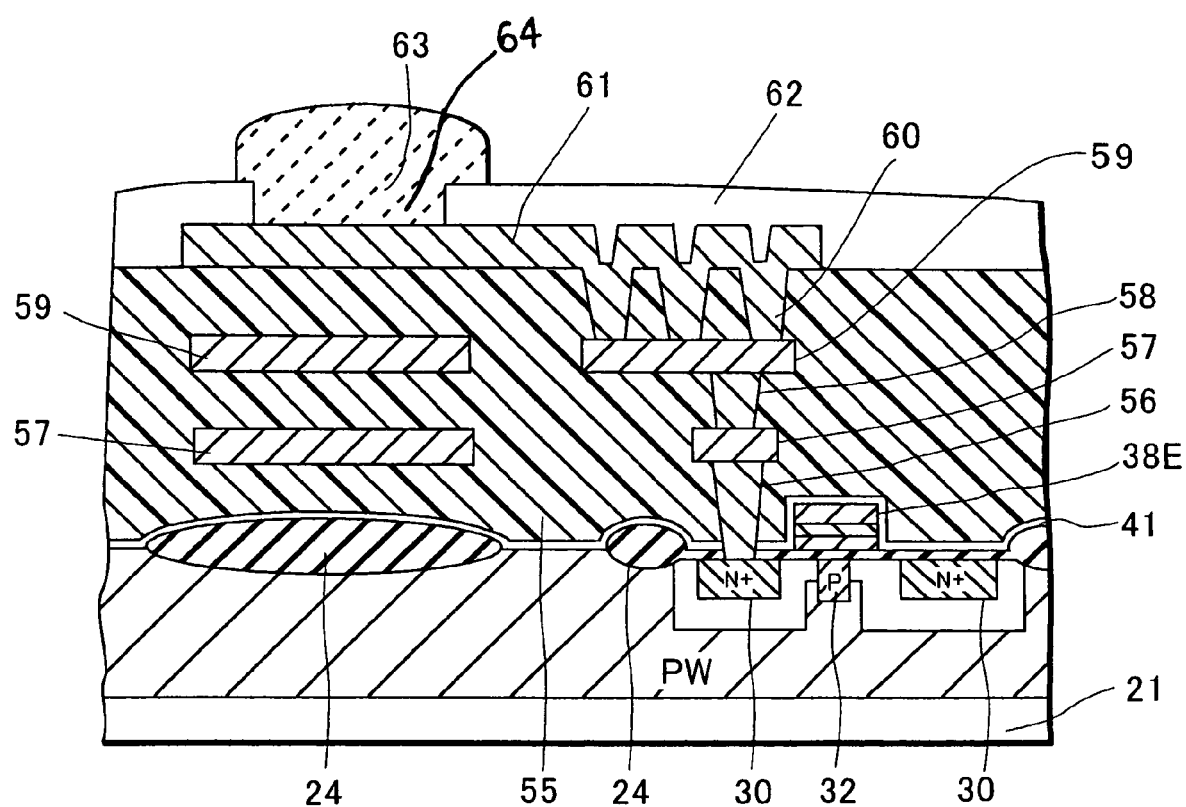
FIG. 13 is a sectional view showing a method of manufacturing a semiconductor device of a second embodiment of the invention.
Figure 14:
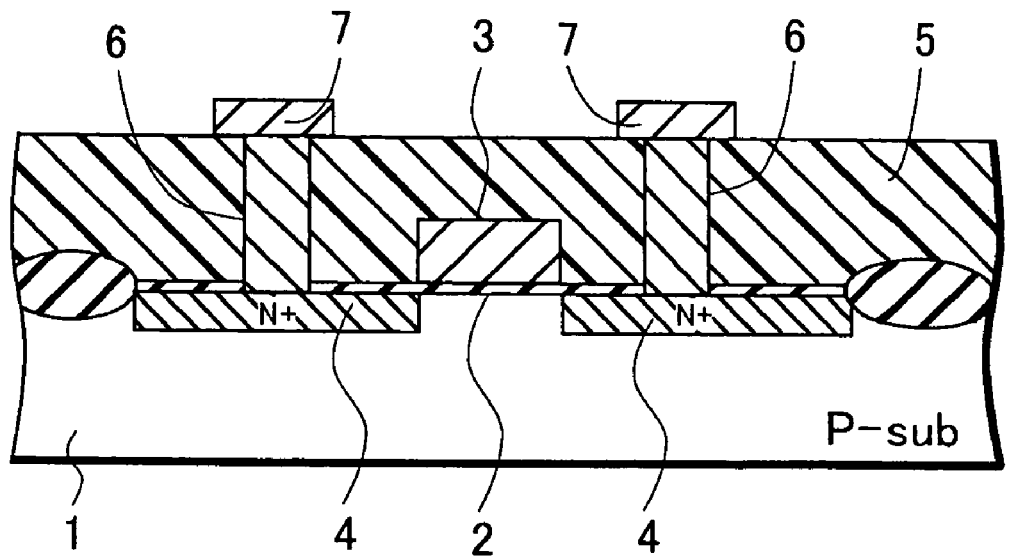
FIG. 14 is a sectional view showing the conventional method of manufacturing the semiconductor.

In FIG. 13, a first layer wiring 57 is formed on a source/drain region 30 (structure of drain side is omitted in FIG. 13) of the N-channel SLEDMOS transistor through a first contact hole 56 formed in interlayer insulating film 55, on the first layer wiring 57, a second layer wiring 59 is formed through a second contact hole 58, and on the second layer wiring 59, a third layer wiring 61 is formed through a via hole 60.

Then, a gold bump electrode 63 is formed at a pad portion 64 formed by opening a passivation film 62 on the third layer wiring 61 extended to separated region from the region forming the via hole 60.

Figure 15:
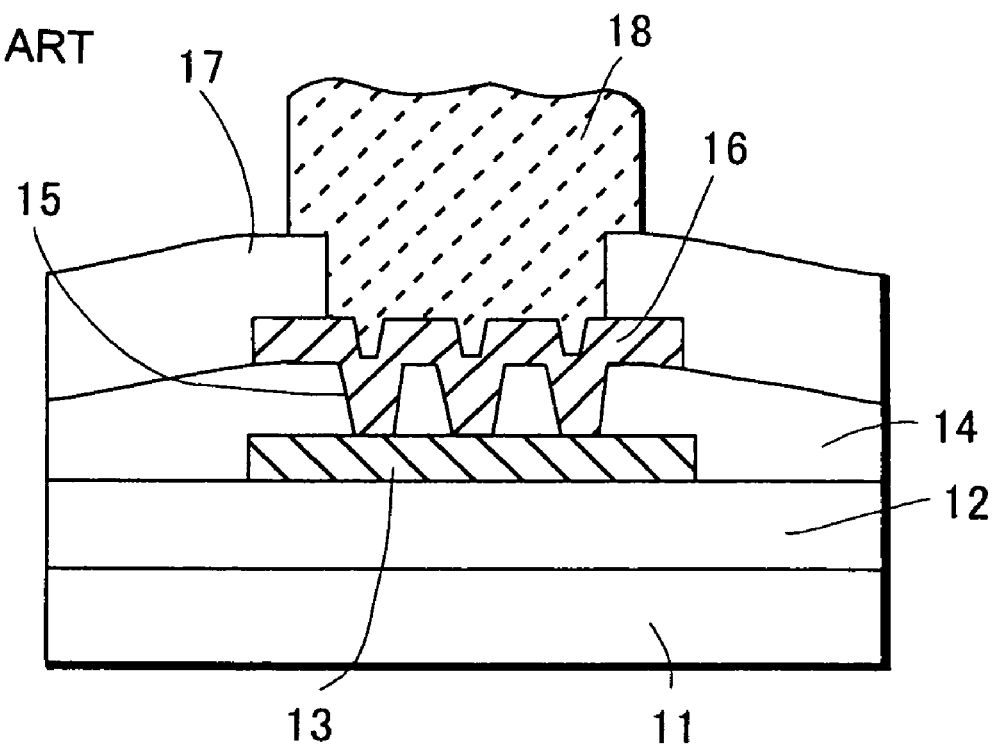
FIG. 15 is a sectional view showing the conventional method of manufacturing the semiconductor.
Figure 16:
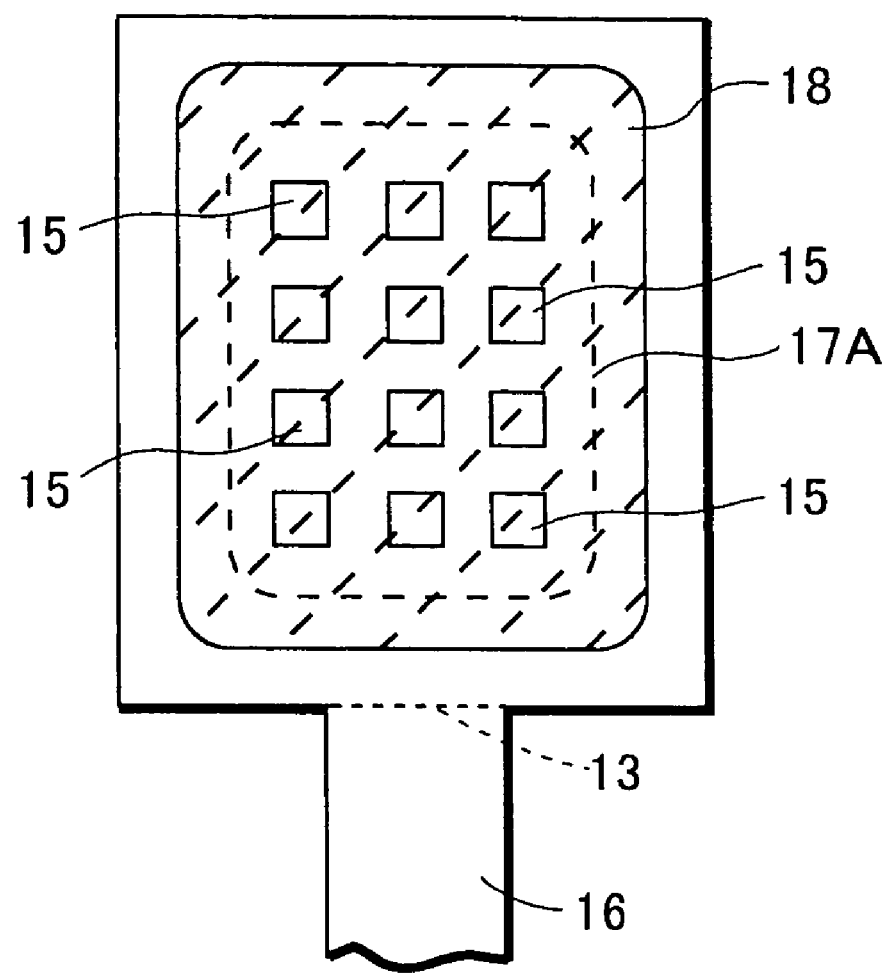
FIG. 16 is a plane view showing the conventional method of manufacturing the semiconductor.

At this time, the above-mentioned third layer wring 61 is formed widely because of being a power source line, and it is need to open wide contact hole for the purpose of reduction of contact resistance at contact-connection with such the wide wiring 61. However, in the case of constitution of various kinds of transistors with michronization process such as 0.35 μm and the like, opening diameter of the pad portion constitutes plural fine via holes because the minimum dimension is applied for dimension of each via hole (contact hole). Because of that, difference in surface of the gold bump electrode 18 remains by having the plural fine via holes 15 under the gold bump electrode 18 as the background art (FIG. 15).

Then, the invention forms via holes 60 at separated region from the gold bump electrode 63 without forming the via holes 60 under the gold bump electrode 63 formed at the pad portion, so that difference in the surface of the via holes does not influence surface of the gold bump electrode like background art. Therefore, decrease of yield at mounting on TAB and the like caused by difference in the surface of the gold bump electrode 63 can be depressed.

That is, in the case of structure of each transistor constituting the display driver with 0.35 μm process such as the embodiment, opening diameter of the pad portion is constituted by plural fine via holes 15 because the minimum dimension is applied for dimension of each via hole (contact hole). Because of that, smoothing of surface of the bump electrode is possible by not forming the via holes under the bump electrode at michronization process according to the invention.

Further, by forming the lower layer wiring (the second layer wiring 59, or the second layer wiring 59 and the first layer wiring 57) even at region under the pad not contacting to the upper layer wiring (the third layer wiring 61), difference in face caused by not forming the lower layer wiring at periphery of the pad portion does not appear thus smooth not damaged.

Although an example applying the semiconductor device having three-layers wiring structure is introduced in the embodiment, the invention may be applied to a semiconductor device of further multi-layers structure.

Further, although the invention is described about the driver for liquid crystal or EL, the invention is also applicable to various flat panel display drivers such as an LED display, PDP (Plasma Display Panel), FED (Field Emission Display) and so on.

According to the first aspect of the invention, reduction of contact resistance is designed by increasing number of the contact portions so as to decrease on-resistance of the transistor.

In the device of the invention having various kinds of transistors and forming contact hole with the minimum dimension in design rule, reduction of contact resistance is designed by increasing number of the contact portions so as to decrease on-resistance of the transistor by setting suitable number of contacts in every transistor and arranging.

Making further low resistance is designed by applying for a contact portion for connecting lower layer wiring and upper layer wiring without limiting to the contact portion for connecting to the source/drain layer.

According to the second aspect of the invention, smooth of surface of the bump electrode is designed because the via hole is not formed under the bump electrode formed at the pad portion.

Smooth of periphery of the pad portion is not damaged by forming the lower layer wiring at region under the pad portion not contacting the upper layer wiring.

What is claimed is:

1. A semiconductor device comprising:
   a transistor formed on a semiconductor substrate, wherein the transistor comprises a source region and a drain region;
   a single first wiring layer which is located above the source region;
   a single second wiring layer which is located above the drain region;
   a first set of interconnects in a first plurality of rows above the source region, wherein each of the first set of interconnects in the first plurality of rows is connected to the single first wiring layer; and
   a second set of interconnects in a second plurality of rows above the drain region, wherein each of the second set of interconnects in the second plurality of rows is connected to the single second wiring layer, and wherein each row in the first and second plurality of rows comprises a plurality of interconnects.

2. The semiconductor device according to claim 1, wherein each of the first and second set of interconnects is formed of a conductive material.

3. The semiconductor device according to claim 1, wherein each row in the first plurality of rows is formed in parallel and each row in the second plurality of rows is formed in parallel.

4. The semiconductor device according to claim 1, wherein:
the first set of interconnects electrically connects the source region to the single first wiring layer; and the second set of interconnects electrically connects the drain region to the single second wiring layer.

5. The semiconductor device of claim 1 wherein each of the lines in the first set of interconnects is directly connected to the single first wiring layer and wherein each of the lines in the second set of interconnects is directly connected to the single second wiring layer.

6. A semiconductor device comprising:
a first transistor formed on a semiconductor substrate, wherein the first transistor comprises a source region and a drain region;
a second transistor formed on the semiconductor substrate, wherein the second transistor comprises a source region and a drain region;
a wiring layer;
first source region interconnects and first drain region interconnects which respectively connect the source and drain regions of the first transistor electrically to the wiring layer;
second source region interconnects and second drain region interconnects which respectively connect the source and drain regions of the second transistor electrically to the wiring layer,
wherein the number of each of the first source region interconnects and first drain region interconnects differs respectively from the number of each of the second source region interconnects and second drain region interconnects.

7. The semiconductor device according to claim 6, wherein the first source region interconnects and first drain region interconnects each comprise a single interconnect and the second source region interconnects and second drain region interconnects each comprise a plurality of interconnects.

8. The semiconductor device according to claim 6, wherein the second transistor further comprises:
a gate electrode formed adjacent to the source and drain regions of the second transistor; and
a semiconductor region constituting a channel formed under the gate electrode.

9. The semiconductor device according to claim 8, wherein:
the second transistor comprises a low concentration region having the same conductive type as the source and drain regions of the second transistor;
the low concentration region is formed under the gate electrode of the second transistor; and
the low concentration region connects the source and drain regions of the second transistor.

10. The semiconductor device according to claim 8, wherein:
the second transistor comprises a low concentration region having the same conductive type as the source and drain regions of the second transistor;
the extent of the low concentration region in the semiconductor region is shallow compared to the source and drain regions of the second transistor; and
the low concentration region connects the source and second drain regions of the second transistor.

11. A semiconductor device comprising:
low concentration source regions and drain regions formed in a semiconductor substrate, wherein the low concentration source regions and drain regions have a conductivity type that is opposite to a conductivity type of the semiconductor substrate;
high concentration source regions and drain regions formed respectively in the low concentration source regions and drain regions, wherein the high concentration source regions and drain regions have the same conductivity type as the low concentration source regions and drain regions;
a gate insulator formed adjacent to the low concentration source regions and drain regions;
a gate electrode formed on the gate insulator;
source region interconnects which are located above the high concentration source regions, wherein the source region interconnects are formed as a plurality of lines; and
drain region interconnects which are located above the high concentration drain regions, wherein the drain region interconnects are formed as a plurality of lines.

12. The semiconductor device according to claim 11, wherein:
the source region interconnects are formed in parallel; and
the drain region interconnects are formed in parallel.

13. The semiconductor device according to claim 11, wherein:
the source region interconnects electrically connect the high concentration source regions to a source electrode; and
the drain region interconnects electrically connect the high concentration drain regions to a drain electrode.

* * * * *